US005727074A

United States Patent [19]
Hildebrand

[11] Patent Number: 5,727,074
[45] Date of Patent: Mar. 10, 1998

[54] METHOD AND APPARATUS FOR DIGITAL FILTERING OF AUDIO SIGNALS

[75] Inventor: Harold A. Hildebrand, P.O. Box 698, Applegate, Calif. 95703

[73] Assignee: Harold A. Hildebrand, Applegate, Calif.

[21] Appl. No.: 621,534

[22] Filed: Mar. 25, 1996

[51] Int. Cl.$^6$ ................................................ H03G 5/00
[52] U.S. Cl. ........................................ 381/103; 333/28 T
[58] Field of Search .................. 381/103, 98; 333/28 T, 333/28 R; 84/622

[56] References Cited

U.S. PATENT DOCUMENTS

| | | |
|---|---|---|
| 4,458,362 | 7/1984 | Berkovitz et al. |
| 4,683,590 | 7/1987 | Miyoshi et al. |
| 4,739,513 | 4/1988 | Kunugi et al. |
| 5,195,141 | 3/1993 | Jang .................. 381/103 |
| 5,210,806 | 5/1993 | Kihara et al. |
| 5,248,845 | 9/1993 | Massie et al. .............. 84/622 |
| 5,384,856 | 1/1995 | Kyouno et al. |

OTHER PUBLICATIONS

Smith, Julius Orion, III, "Techniques for Digital Filter Design and System Identification, with Application to the Violin", 1987, UMI Dissertation Information Service, Ann Arbor, Michigan.

"Digital Signal Processing Issues in the Context of Binaural and Transaural Stereophony" by Jean–Marc Jot, Veronique Larcher, Olivier Warusfel, Presented at the 98th Convention 1995 Feb. 25–28 Paris, AES, An Audio Engineering Society Preprint, pp. 1–36, plus drawings of Figs. 1–10b.

Mourjopoulos, "Digital Equalization of Room Acoustics", J. Audio Eng. Soc., vol. 42, No. 11, 1994 Nov.

Greenfield & Hawksford, "Efficient Filter Design for Loudspeaker Equalization", J. Audio Eng. Soc., vol. 39, No. 10, 1991 Oct.

Salamouris, et al., "Digital System for Loudspeaker and Room Equalization", 98th AES convention, Feb. 1992.

Craven & Gerzon, "Practical Adaptive Room and LoudspeakerEqualiser for Hi–Fi Use", AES 92th Convention, Mar. 1992.

Genereux, "Adaptive Filters for Loudspeakers and Rooms", 93rd Convention of AES, Oct. 1992.

Elliott, et al., "Practical Implementation of Low–Frequency Equalization Using Adaptive Digital Filters", J. Audio Eng. Soc., vol. 42, No. 12, Dec. 1994.

Wilson, "Filter Topologies", J. Audio Eng. Soc., vol. 41, No. 9, Sep. 1993.

Oppenheim and Schafer, "Digital Signal Processing", Prentice–Hall, Inc., pp. 226–230, 1975.

*Primary Examiner*—Curtis Kuntz
*Assistant Examiner*—Vivian Chang

[57] ABSTRACT

The present invention provides an efficient audio equalization system in terms of the number of coefficients and taps of a digital filter. The processing efficiency of the system allows it to provide audio equalization with high resolution at low frequencies using a 1/20-th the number of coefficients and taps in equivalent prior art systems. The resulting reduction in cost makes it economical to incorporate the system in hi-fi systems, home theaters, automobiles, televisions, etc. providing significantly improved sound quality with little or no overall increase in cost of production.

10 Claims, 7 Drawing Sheets

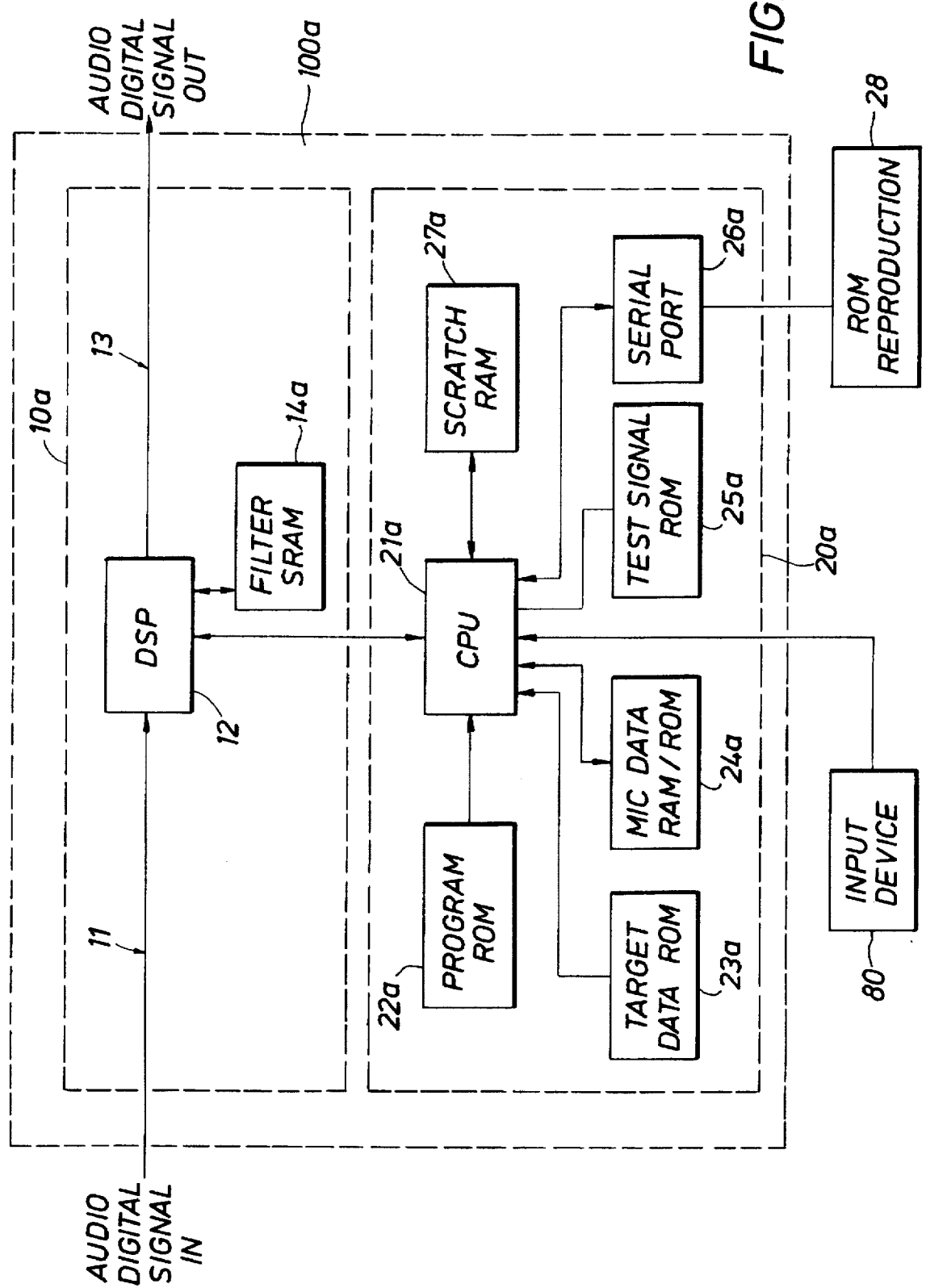

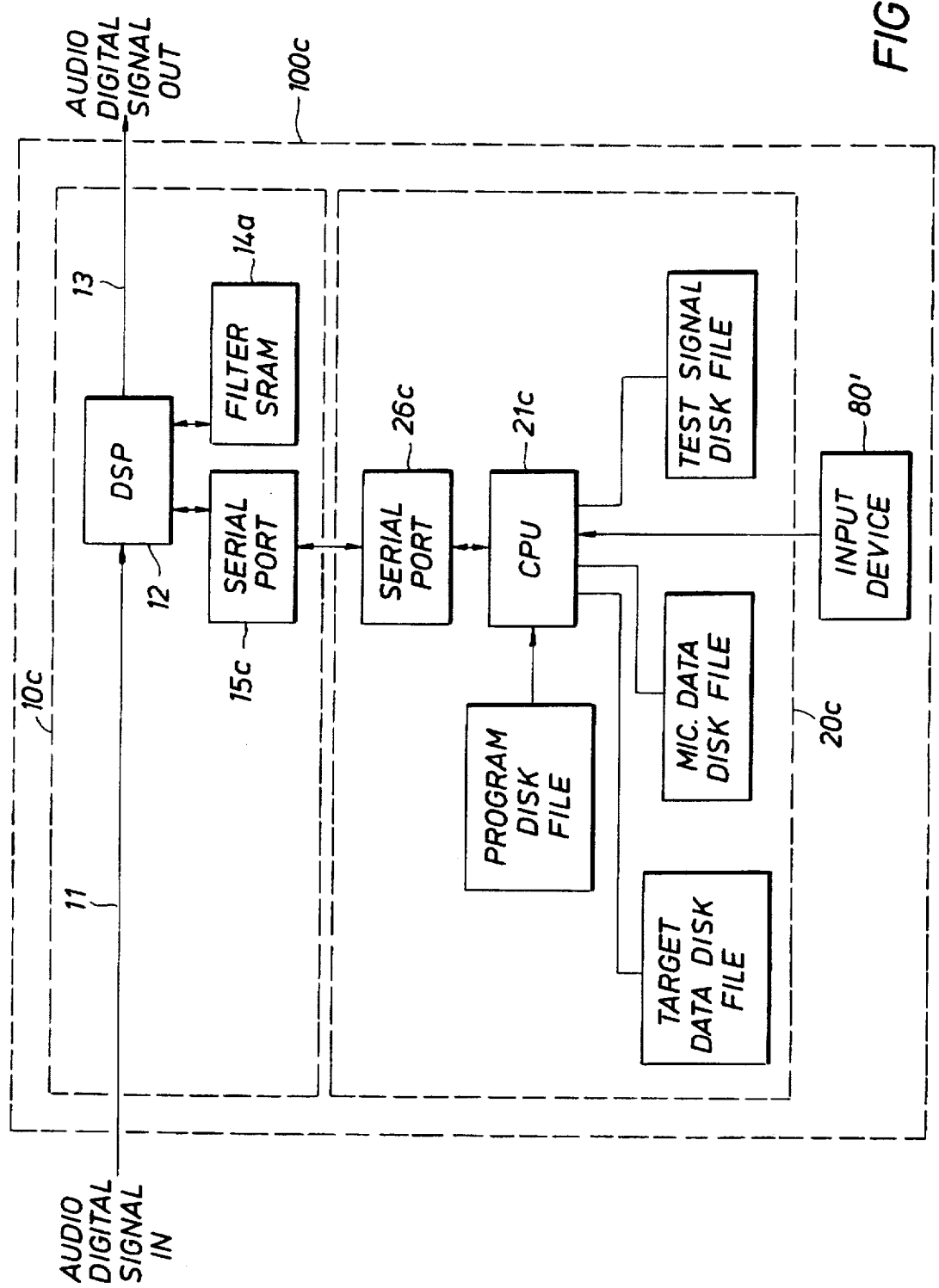

METHOD AND APPARATUS FOR DIGITAL FILTERING OF AUDIO SIGNALS

BACKGROUND OF THE INVENTION

1. Field of the Invention

This invention relates to an audio reproduction apparatus, called a digital time domain equalizer, which allows the reproduction of audio signals to be controlled in such a way as to correct for imperfections in speakers, listening spaces and other elements of an audio reproduction system, and allows additional desired spectral characteristics, to be inserted into the audio signal.

2. Description of Prior Art

A transfer function of an audio reproduction system generally should be uniformly flat in amplitude as a function of its frequency spectrum. Also, in general, the system should have no severe phase distortions over its frequency spectrum. Such characteristics are important in recording studios where a flat spectrum makes it easier for the artist or producer to hear all frequencies and timing elements of the sound. There are exceptions to these generalizations. First, it is important that a system transfer function have a low cut filter with a corner frequency, say at 40 Hz. This is required because speakers are not physically capable of generating frequencies below a certain (speaker dependent) frequency. Second, some systems are specifically designed to have a transfer function "colored" by slightly boosting or attenuating certain frequencies. Third, production studios often choose to hear their "mixes" on systems that mimic the sound inside of an automobile, or via a radio, or sound system, or television in a room. Such systems are significantly non-flat in their frequency response.

Deviations from a desired amplitude spectrum (amplitude versus frequency) are a major problem in an audio reproduction system. The biggest culprits are the speakers and listening spaces. The amplitude-frequency spectrum of a speaker is generally not flat, and the amplitude spectrum of a room or auditorium is also not flat. Deviations in the amplitude spectrum also change with location of the listener in a listening space. This is because the radiation pattern of a speaker causes amplitudes as a function of frequency to vary with angles (horizontal and vertical) from the centerline of the speaker. Also, the effects of the listening space geometry cause frequencies to vary in intensity as a function of position. This causes narrow and broad variations in the frequency response that change as a function of the listener's location.

Other problems in speakers and listening spaces are adequately documented in U.S. Pat. No. 4,458,362 and which is incorporated herein by reference.

At this point it is instructive to describe what is meant by the term digital equalizer. A digital equalizer is a digital processor, typically a special purpose microprocessor which is programed to perform the operations of a digital filter for the purpose of compensating for errors in the transfer function of a system. Typically, such microprocessor is called a Digital Signal Processor or a DSP. A digital filter is one embodiment of a discrete- time filter. An instructive description is provided at columns 11 and 12 of U.S. Pat. No. 4,458,362 mentioned above:

"Any linear network or system with input and output terminals can be characterized by describing its properties in terms of either the "frequency domain" or the "time domain". A 'frequency domain' description of a system is one in which amplitude and phase of an output signal from the system are represented as a function of signal frequency. In the frequency domain, one does not deal explicitly with time functions but instead, for example, with Fourier or Laplace transforms and the like, which are functions of frequency. On the other hand, the "time domain" description is one in which the amplitude of the output signal of the system is represented purely as a function of time. Typically a time domain description is contained in the impulse response of the system to an input impulse which ideally is of infinitesimal duration and unit amplitude. It is recognized that the time domain and frequency domain systems are mathematically related, and typically one may be transformed into the other by known transformations. For example, in the frequency domain the transfer function of the network or system can be described as the Fourier transform of its impulse response.

"In contrast to conventional equalizers which are designed according to frequency domain specifications, [A digital filter]... "operates in the time domain, and employs discrete-time filter means specially adaptable for equalizing the sound arriving at a listener's selected location." [In a digital system the sound is sampled]... "in the time domain, a process which translates such samples into numerical values, and then the latter are convolved with a set of predetermined filter coefficients. Methods of generally implementing digital filters are widely described in the literature and will not be dealt with here in minute detail. An excellent explanation of digital signal processing is entitled *An Introduction to Discrete Systems*, Kenneth Steiglitz, John Wiley Sons, New York, 1974.

"A sampled and digitized signal of speech, music or any other time-varying quantity can be considered as a sequence of impulses of varying amplitude and polarity, the magnitude and polarity of any impulse corresponding to the magnitude and polarity of the original signal waveform at the exact time of sampling. Similarly, a digital representation of the impulse response of a filter, after the impulse response has been sampled and digitized, consists generally of a finite sequence of numbers, the numbers corresponding to amplitude during consecutive sampling periods, i.e. spaced equally apart in time. Each such number in the series bears a fixed proportional relation to the others. Any convenient numerical scale can be used to represent the filter impulse response, which is fully defined by this proportional relation. The absolute values of the numbers in the sequence are exactly proportional to the magnitude of the applied impulse, and it is common to assume in such descriptions that this magnitude has a numerical value of 1.0, with the impulse designated the unit impulse, $S(n)$, although clearly one can arbitrarily scale the numbers of the sequence. Convolution of a digital filter impulse response and a sampled digitized signal will thus create a sequence of sums of scaled filter impulse response. The result of the convolution process is an output signal as described in the following exemplary way, simplified for purposes of exposition.

"As is generally understood the values of the filter impulse response need not correspond to the physical response of any existing analog filter or system, but can be simply any sequence of numbers designated a filter. It is therefore possible to create a digital filter which could be synthesized with analog filter components, such as a sparsely populated filter i.e. one in which a section of the filter impulse response is zero.

"When used to carry out discrete convolution as described hereinafter, the filter numbers are ordinarily referred to as 'coefficients'. A conventional mathematical expression for the convolution process, derives the final output signal values one at a time by summing the products of previous consecutive input signal values and the coefficients:
where $$y(n) = \sum_{j=0}^{m-1} c_j x(n-j) \quad (1)$$

x(n) is the input signal to the filter at discrete time n, m is the number of coefficients:

$c_j$ are the filter coefficients, i.e., the numerical values of the coefficients m of the filter impulse response;

j is an index from o to m, and y(n) is the output signal from the filter."

Systems designed to correct for undesired deviations from a desired spectrum in audio reproduction systems are known as equalizers. The term equalizer refers to a system which compensates or corrects for undesired amplitude-frequency response of an audio reproduction system with respect to a given environment. More precisely, an equalizer is a device which alters the transfer function of one part of a system to compensate for errors in the transfer function of another part of that system; although the parts of the system may have non-uniform individual transfer functions, the overall performance of the system is thus improved.

Digital or "sampled data" systems use a z transformation for ease of analysis. The z transformation is entirely analogous to the Laplace transformation and its application to continuous or time domain systems. It turns out that, for systems having lumped constants, that is, those which are described by linear difference equations with constant coefficients, the z transformation gives expressions which are rational polynomial ratios in the variable z. This variable is complex and is related to the complex frequency s used in the Laplace transform by the relations $z=e^{Ts}$. In z-transform theory, such concepts as the transfer function, mapping theorems, combinatorial theorems, and inversion bear the same powerful relation to sampled-data system as does the Laplace transformation to continuous systems.

There are two varieties of equalizers: The first are multi-band equalizers. (See U.S. Pat. No. 4,739,513, U.S. Pat. No. 5,384,856, U.S. Pat No. 5,195,141 and U.S. Pat. No. 5,210, 806.) Because this invention does not relate to multiband equalizers, a discussion of their characteristics is not made here.

The second variety of equalizers are digital time domain equalizers (or simply "digital equalizers") which contain time domain filters or simply "digital filters" and are designed as a FIR (finite impulse response) or an IIR (infinite impulse response) filter for implementation in DSPs (digital signal processors).

Prior art methods and apparatus for FIR and IIR filter design for digital equalizers involve the playing (insertion or performance of) of a test signal into the audio system and recording the resulting sound signal on a calibration microphone. Such sound signal is then used as the input for the design of a digital filter. Filter design methods can be found by searching in the technical literature under the term "deconvolution". For example, prior art FIR and IIR filter design methods are known by such names as "Wiener filtering", "least squares deconvolution", "maximum likelihood estimation", "maximum entropy spectral estimation", "Prony Method", "adaptive filter" and so on. Such methods often involve equations called the Yule-Walker equations or the "normal equations". Solutions to these equations often involve the Levinson recursion, the Toeplitz recursion, or the Burg process. The resulting FIR or IIR filter, when applied to the audio input data, results in a system transfer function of the audio reproduction system that is more flat.

All existing filters designed according to one of the above methods and then stored in a time domain equalizer suffer from a common problem: they require large and expensive computational resources. Said another way, the number of filter coefficients in equation (1) (or a similar equation) described above must be very large in order to achieve an acceptable amplitude-frequency characteristic of the audio system. There is a fundamental reason for this: all of the known filter design methods determine filters whose zeroes (or poles) are nearly uniformly distributed on the unit circle (in the z domain). In other words, these filters inherently assume that all frequencies are equally important in the system frequency spectrum and have uniformly distributed resolution of amplitudes as a function of linear frequency. Specifically, for a sample rate of 44.1 kHz, (22,050 Hz of bandwidth), the amplitudes at frequencies from 500 to 1000 Hz are given as much attention in creating a flat amplitude vs. frequency characteristic, as the amplitudes at frequencies from 20,000 Hz to 20,500 Hz.

A human ear works differently. The human ear assigns the same importance to sounds of all octaves in frequency. That is, the ear works logarithmically in frequency. The frequency range of 250 Hz to 500 Hz is a 250 Hz range. That range is subjectively as important as the frequency for 2,500 Hz to 5,000 Hz, a 2,500 Hz range. Consequently, the ear distinguishes with very high resolution in the frequency spectrum at very low frequencies, but with less resolution with increasing frequency.

This human ear resolution phenomena is well understood, and the need to provide high resolution at low frequencies is the primary focus of current research. Several techniques are used to do this. The first is to simply add more filter points to an FIR filter. This increases low frequency resolution by increasing the resolution at all frequencies. A typical DSP chip can process 200 filter taps in stereo at a 44.1 kHz sample rate. Mourjopoulos, *"Digital Equalization of Room Acoustics"*, J. Audio Eng. Soc., Vol 42, No. 11, 1994 November demonstrates speaker/room deconvolution using 32,768, 4096 and 2048 FIR filter taps. Greenfield & Hawksford, *"Efficient Filter Design for Loudspeaker Equalization"*, J. Audio Eng. Soc., Vol 39, No. 10, 1991 October, states "the number of [FIR] coefficients required to equalize low-frequency anomalies of high-Q resonances [high resolution] is too great for existing digital signal processor." Salamouris, et. al., *"Digital System for Loudspeaker and Room Equalization"* 98th AES convention, February '92 describes the DEAS system (under development) which uses a custom transverse filter to achieve 1200 FIR filter taps per channel (stereo operation).

Another technique to provide high resolution at low frequencies is the use of a lower sample rate. The same DSP that can process 200 filter taps at 44.1 kHz sample rate (giving a filter length of 200/44.1 k=0.0045 sec.), can process 8,820 filter taps at a 1,000 Hz sample rate (giving a filter length of 8,820/1000=8.820 sec.) The longer time length of the filter corresponds to increased low frequency resolution. Multirate filtering refers to using two or more sample rates for filtering, those being the data sample rate (say, 44.1 kHz) and a lower sample rate, typically 1,000 Hz. For example, Craven & Gerzon, *"Practical Adaptive Room and Loudspeaker Equalizer for Hi-Fi Use"*, AES 92th Convention, March '92, propose a system that takes 48 kHz sampled data and down-samples (digital anti-alias filter and decimate) to a sample rate of 1000 Hz (500 Hz bandwidth). This low frequency data is then filtered and then up-sampled (more digital filtering) to the 48 kHz sample rate. The original 48 kHz data is also filtered and the two data streams are recombined using crossover filters.

A disadvantage of multirate sampling is that it requires a large number of computations to down-sample and up-sample the data, to provide crossover filters, and to filter two or more streams of data. Another failing is that the resulting frequency domain resolution, although improved in low frequencies, results in a stair-stepping of the frequency domain resolution, requiting overly-dense low frequency resolution just before a sudden change to a much less-dense high frequency resolution. To smooth this out requires even more multirate filters with more inefficient down-sampling and up-sampling, etc.

A variation of multirate filtering is described by Genereux, *"Adaptive Filters for Loudspeakers and Rooms"*, 93rd Convention of AES, 1992, October, which provides information on the only existing commercially available system, the AEC 1000. This system uses a 2,544 tap filter per channel at 44.1 KHz. The design of a filter, is based on a multirate concepts and is described as: "High resolution is obtained at low frequencies by using a filter with a long impulse response. Then by selectively controlling the various segments of the filter's response, resolution can be made to decrease as frequency increases."

Finally, certain schemes completely ignore high frequencies: Elliott, et.al., *"Practical Implementation of Low-Frequency Equalization Using Adaptive Digital Filters"*, J. Audio Eng. Soc., Vol 42, No. 12, 1994 December, describes a filter using 130 FIR coefficients to process data in the frequency range 0 to 400 Hz. Berkovitz & Genereux, U.S. Pat. No. 4,458,362, present methods using a DSP to correct for frequencies only below 500 Hz.

3. Identification of Objects

A primary object of this invention is therefore to provide an improved equalization system for an audio reproduction system. Particularly, an important object of the invention is to provide an equalization system which has a digital filter which provides more resolution for low frequency signals than for high frequency signals.

Another object of the present invention is to provide an efficient audio equalization system which avoids wasteful computations in prior art digital filter designs thereby providing the capability to incorporate a digital filter design into an inexpensive device used to accomplish digital audio equalization.

Another object of this invention is to provide a new method for determining time domain filters implemented in the equalization system.

SUMMARY

The objects identified above and other advantages and features of the invention are incorporated in a method for producing a digital filter which includes the following steps:

(1) Transforming time domain data into the frequency domain through a Fourier transform. The resulting frequency spectrum is then modified by stretching its low frequencies and "compressing" its high frequencies in a specific way. Such stretching of low frequencies and compressing of high frequencies is called "warping" in this description of the invention. Warping of the frequency spectrum results in data where equal ranges of frequency are equally important to the human ear.

(2) Creating an FIR or IIR filter by using the warped frequency spectrum as the basis for a method of producing filter. Any conventional filter design method may be used such as those listed above.

(3) Transforming the filter specified in step 2 into a new filter (always as an IIR filter) by inverse warping of the filter.

Using the steps above, a time domain filter, (that is a digital filter) is produced that has high resolution at low frequencies and less resolution at higher frequencies. Because this resolution property is similar to the acuity of human heating, the ear perceives an equal qualitative improvement at all frequencies. The finite computational capacity of the system contributes a uniform perception of improvement to all frequencies with no computational waste. Therefore, such filter is efficient, allowing a single DSP chip to perform digital equalization on two or more channels of hi-fi audio data. In other words, fewer coefficients and delay taps are required to obtain improvements in the amplitude-frequency spectrum of the audio reproduction system.

Warping of the frequency spectrum is accomplished by using the warping characteristics of a $G(Z^{-1})$ transformation.

That is, the $G(Z^{-1})$, transformation is used to map a plurality of amplitudes and phases at uniformly spaced frequencies into amplitudes and phases at new frequencies which are dense at low frequencies and less dense at high frequencies (or vice-a-versa). Thereby, the final IIR filter has high resolution at low frequencies and less resolution at higher frequencies.

The mathematical optimization performed in the filter design of step 2 (typically a least squared error formulation) honors all frequencies the same and has uniformly distributed resolution of amplitudes as a function of linear frequency. But in the "warped" frequency space of step 2, uniform ranges of frequency are equally important to the human ear. Hence a filter designed in step 2 is profoundly efficient, and generates no waste in computation. Also, because the forward warping transformation of step 1 and the inverse transformation of step 2 change only frequencies, not amplitudes or phases, then desirable properties of the filter design are preserved. Specifically, achieving a flat frequency response in step 2 results in a flat frequency response in the final filter created in step 3. Also, desirable phase attributes of the filters are preserved: minimum phase filters of step 2 become minimum phase in the final filter created in step 3. The final IIR filters have high resolution at low frequencies and less resolution at higher frequencies.

The filter created by steps 1–3 are embodied in apparatus for modifying the audio response of an audio reproduction system, particularly in the form of an improved audio equalizer. An apparatus and method are provided for introduction of a test signal into the audio reproduction system. A microphone is used for detecting the acoustic output produced by the speaker of the audio reproduction system in response to the test signal at multiple locations in the listening space. A target transfer function is provided which has an arbitrary desired amplitude vs. frequency spectrum. The frequency response of the microphone is used in the system in a manner that removes the imperfections of the microphone from the equalizer. The coefficients and time slots of the digital filter produced are provided in a digital signal processor (DSP) circuit to physically realize the digital filter.

The processing efficiency of the system allows it to provide audio equalization with high resolution at low frequencies using a ¹⁄₂₀-th the number of coefficients of prior art systems with equivalent equalized response. This reduction in cost makes it economical to incorporate digital audio equalization in hi-fi systems, home theaters, automobiles, televisions, etc., thereby providing significantly improved sound quality and an overall cost reduction achieved by using less expensive speakers and fewer DSP circuits.

DESCRIPTION OF THE DRAWINGS

The objects, advantages and features of the invention will become more apparent by reference to the drawings which are appended hereto and wherein an illustrative embodiment of the invention is shown, of which:

FIG. 3 illustrates one embodiment of the invention, where a digital filter is produced and applied to an audio system or applied to apparatus for producing the filter on a ROM;

FIG. 5 illustrates a third embodiment where a personal computer is used to perform some of the operations depicted in FIG. 1;

DESCRIPTION OF THE INVENTION

Before a detailed description of the invention is presented, it is useful to present definitions. The term "audio reproduction system" is a broad term which refers to all elements of a signal path beginning with the source of the audio to the listener. Elements of the signal path include the reproduction equipment, the speakers, the listening environment (room, automobile, etc.) and the presence of the listener(s).

In the first preferred embodiment of the invention shown in FIG. 3, apparatus is provided by which an operator initiates the processing of audio data through the apparatus in such a way as the apparatus functions as a digital time domain equalizer. Specifically provided is an arrangement by which the operator may select among multiple filters. The filter coefficients of one or more filters are moved into the DSP and applied to the time-sampled sequence of points arriving from the digital input in such a way as to generate a time-sampled sequence of points passed to the digital output.

Figure 4:
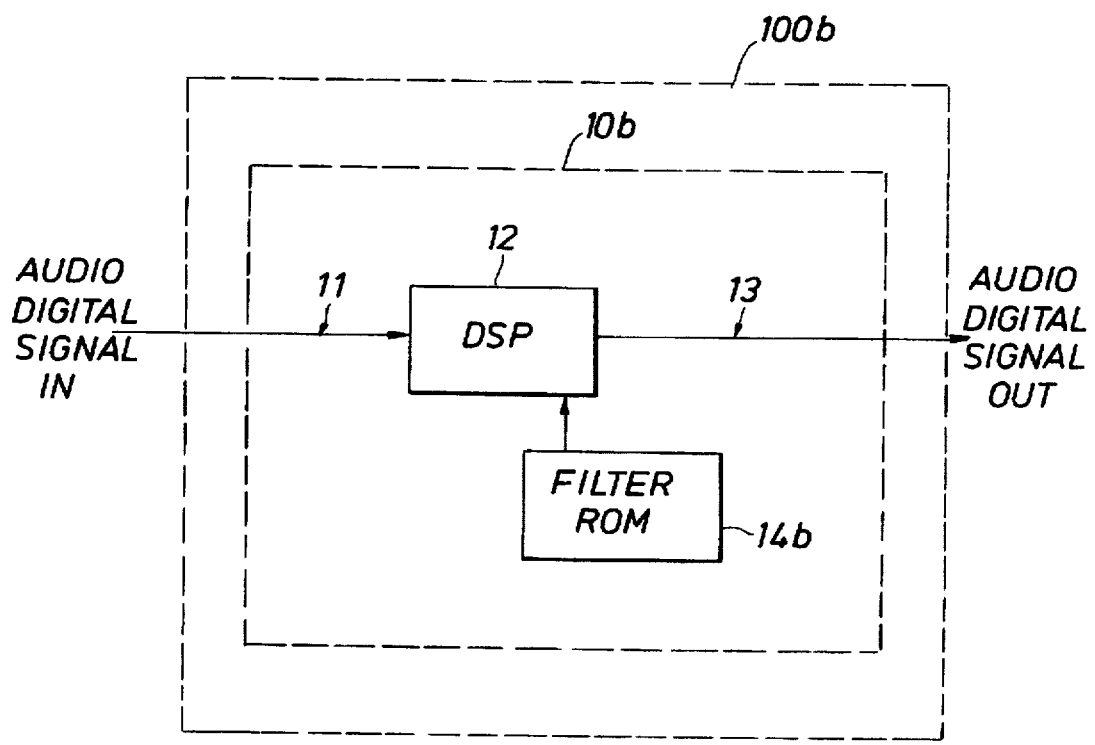
FIG. 4 depicts a second embodiment of the invention where a digital filter that is stored on a ROM is used to program a DSP of an audio system for a car, a television, a home stereo unit, etc.

In the first preferred embodiment shown in FIG. 3, an arrangement is provided for outputting one or more filters via a serial port 26a to ROM reproduction equipment, 28. The purpose of this feature is apparent in the second embodiment of the invention illustrated in FIG. 4, where the DSP Section 10b is a stand-alone DSP (without connection to a CPU as in FIGS. 3, 5), and the filter coefficients are provided by a filter ROM 14b. The filter ROM 14b is produced by reproducing copies of a ROM created by ROM reproduction 28 (FIG. 3). The embodiment of FIG. 4 is appropriate where the invention is to be included in audio reproduction systems which are mass produced and have similar acoustic properties (e.g. automobiles, speaker systems, televisions, home theaters and computers for multimedia).

In the third preferred embodiment shown in FIG. 5, the DSP Section 10c is connected to a personal computer 20c and to its CPU Section 21c via a serial link using Serial Ports 15c and 26c, respectively. This implementation is appropriate where the computer Section 20a of FIG. 3 is replaced by a personal computer 20c. This embodiment provides an inexpensive DSP Section 10c that can be purchased for home hi-fi use.

The notation H(z), when used to denote an IIR filter (or transfer function) has a z-domain representation given by $$H(z) = \frac{\sum_{k=0}^{N} a_k z^{-k}}{1 + \sum_{k=1}^{N} b_k z^{-k}} \quad (2)$$

The operation of this IIR filter involves a sequence of input numbers, $x_i$, and a sequence of output numbers, $y_i$, related by the computation, $$y_i = \sum_{k=0}^{N} a_k x_{i-k} - \sum_{k=1}^{N} b_k y_{i-k} \quad (3)$$

If all the $b_k$=0, then H(z) is termed an FIR filter (or transfer function).

The notation FFT is used to denote the Fast Fourier Transform, as commonly found in the signal processing literature. The term FFT is used as a notational convenience, it being understood that the principles of the present invention can be carried out with similar means, such as using a standard Fourier Transform or a Cosine Transform. For any array of FFT data, know as frequency domain data, there is an equivalent array of time domain data. The frequency domain data (in the case of a digital or time sampled system, the "z" domain) is computed by applying the FFT to the time domain data. The time domain data is computed by applying the inverse FFT to the frequency domain data. Certain equivalent computations can be performed in either the time domain or the frequency domain, although the form of the computation may change (e.g., convolution in time domain verses multiplication in the frequency domain). Also, time domain data may be equivalently transformed in the form of a z transform, such as F(z), etc. The notation A[] is used to denoted an array of data values, such as a sequence of real time-sampled data or a sequence of complex FFT coefficients, depending on the context.

Referring now to FIGS. 1, 2, 3, 4, 5, 6, 7, 8 and 9 a digital time domain equalizer created by the methods of the present invention is shown in certain illustrative embodiments, for example in a single channel audio system, but the principles of the present invention are equally applicable to multichannel systems such as stereophonic systems. The principles of the present invention are equally applicable to more generalized equalizer systems, such as discussed in U.S. Pat. No. 4,683,590, incorporated herein by reference.

Figure 1:
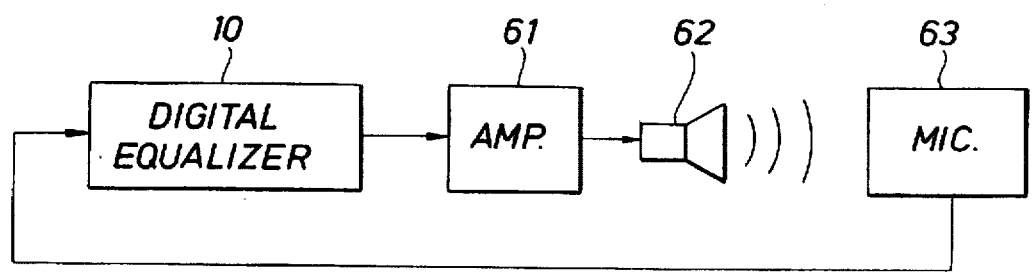
FIG. 1 illustrates interconnections of a generalized audio reproduction apparatus during the calibration process.
Figure 2:
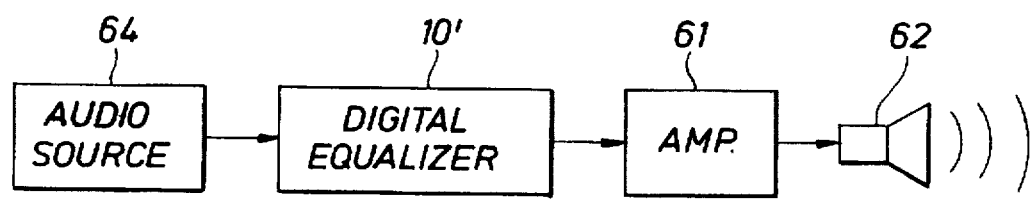
FIG. 2 illustrates the interconnections of a generalized audio reproduction apparatus during normal operation.

FIG. 1 is a schematic illustration which depicts the arrangement of audio equipment which must be used during the process of acquiring measurements. It shows a mode of operation of the arrangements of FIGS. 3 and 5. Signals applied to the digital equalizer 10 are digital in form. Accordingly, continuous or analog signals are applied to an analog to digital (A/D) converter before they are input to the digital equalizer 60a. Signals output from digital equalizer are applied to a digital to analog (D/A) converter for application to an amplifier 61. The digital equalizer 10' of FIG. 2 is the object of invention as ultimately created using the arrangements of FIGS. 3 and 5. The digital filter so created is embodied in the DSP circuits and storage media for filter coefficient and taps of FIGS. 3, 4 and 5.

An audio amplifier 61 is connected to the output of the digital equalizer 10 of FIG. 1. The connection between the digital equalizer 10 and the audio amplifier 61, the type of connectors, and the wiring arrangement can be any of several appropriate industry standards including EAS/EBU (digital), S/PDIF (digital), optical (digital), balanced line (analog) or unbalanced line (analog). The audio amplifier 61 is in turn attached to a speaker or speaker assembly 62 using a two wire speaker cable. During the measurements process, a test signal is emitted by the digital equalizer 10 and passes through the audio amplifier 61 to the speaker or speaker assembly 62. The resulting sound is detected by a microphone 63. The output of the microphone is attached to the input of the digital equalizer 10 where the type of connectors and wiring can be any of several appropriate industry standards including EAS/EBU (digital), S/PDIF (digital), optical (digital), balanced line (analog) or unbalanced line (analog).

FIG. 2 depicts the connection of audio equipment which is used during the equalization of audio signals. The digital equalizer 10' is a modified version of the digital equalizer 10 of FIG. 1 and is the object of the invention ultimately to be embodied in any of the DSP section of FIGS. 3, 4 and 5. The audio amplifier 61 and the speaker or speaker assembly 62 are connected together in the same way as described in relation to FIG. 1. The audio source 64 depicts a CD player, turntable, tuner, tape player, microphone, mixer output, television or any other source of audio data. The type of connectors and wiring between the Audio Source 64 and Digital Equalizer 60b can be any of several appropriate industry standards including EAS/EBU (digital), S/PDIF (digital), optical (digital), balanced line (analog) or unbalanced line (analog).

FIG. 3 is a block diagram of an arrangement 100a including an equalizer section 10a for a producing a digital filter for embodiment in a DSP 12. The apparatus of FIG. 3 includes an equalizer section 10a and a CPU Section 20a. The equalizer section 10a includes Audio Digital In lead 11, an Audio Digital Out lead 13, Filter SRAM 14a, and a DSP 12. The DSP 12 is preferably a Motorola DSP 56002 chip.

The CPU Section 20a includes a CPU 21a, a program ROM 22a, a Target Data ROM 23a, a Mic Data RAM/ROM 24a, a Test Signal ROM 25a, a serial port 26a, and a Scratch RAM 27a.

The term CPU stands for "central processing unit", the term DSP stands for "digital signal processor", the term RAM stands for "random access memory", the term SRAM stands for "static random access memory", the term ROM stands for "read only memory", and the term Mic stands for "Microphone".

The Digital Audio signal lead In 11 is so named because the flow of data from the Digital Audio In to the DSP 12 is digital serial data as conventionally applied to the SCI port of the DSP 12. Audio digital data is provided from connecting input sources from EAS/EBU (digital), S/PDIF (digital), optical (digital), balanced line (analog) or unbalanced line (analog) via a plurality conventional circuits.

The Audio Digital Signal Out lead 13, is so named because the flow of data from the DSP 12 lead 13 is digital serial data as conventionally used by, for example, a Motorola DSP56002 SCI port. Audio Digital Signal Out signal on lead 13 is applied to a plurality of circuits which provide a means of connecting outputs for EAS/EBU (digital), S/PDIF (digital), optical (digital), balanced line (analog) or unbalanced line (analog) outputs.

The circuits which provide Digital Audio signals In lead 11 and Audio Digital signals on Out lead 13 include conventional circuits for modulation/demodulation and flow control (as in the Motorola DSP56401), A/D and D/A conversion (as in the Crystal CS5389 and CS4328), common mode separation, anti-CMOS latch-up, balanced line drivers, unbalanced line drivers, impedance matching and transformer isolation.

A DSP 12 is a device like the Motorola DSP56002 chip. The Filter SRAM 14a, the Filter ROM 14b of FIG. 4 are memory devices for storage of filter coefficients, and, depending on the DSP, a filter program.

A CPU 21a of CPU Section 20a is a general purpose programmable micro-processor, such as a Motorola 68000. A Program ROM 22a stores a sequence of machine instructions executed by the CPU 21a. Flowcharts for such programs are illustrated below. A Target Data ROM 23a stores data which describes one or more target transfer functions, either as a time impulse response, or FFT coefficients.

A Mic Data ROM/RAM 24a stores data which describes the microphone used to take the listening space measurements. The format can be either as a time impulse response, or FFT coefficients. In the case where RAM is used, a computer program in CPU 21a is provided where the operator can read the data values input from a mass storage device (not shown).

A Test Signal ROM 25a stores a test signal used in the measurement process. Under control of CPU 21a, a test signal from Test Signal ROM 25a is applied to DSP 12 so that a test signal can be applied to amplifier 61 and speaker 62 as in FIG. 1.

A Scratch RAM 27a is provided for temporary storage of intermediate values in the measurement and filter design production. Such scratch RAM 27a is used by CPU 21.

In the arrangement of FIG. 3, the apparatus includes CPU 21a programmed to accomplish the process of collecting a measurement. A time-sampled sequence is generated, called the test signal, and which is routed through the DSP 12 to the digital output. Means are also provided for simultaneously routing data at the digital input (e.g., via AUDIO DIGITAL SIGNAL IN lead 11) (to which is connected a microphone) through the DSP 12, into the SCRATCH RAM 27a of the CPU 21a to be stored as a time-sampled sequence. Multiple occurrences of generation of the test signal are provided. Each such occurrence results in a new input time-sampled sequence to be summed with the previous time sampled sequences. All such multiple occurrences create a single time sampled sequence which is termed a "measurement".

When collecting multiple measurements, an operator places the microphone at different locations in the listening space and manually initiates the equipment in order to collect a new measurement.

In the first arrangement of FIG. 3, an input device 80 (such as a keyboard) is provided for the operator to start the generation of a filter. The operator specifies or inputs a description of the microphone that is used (in Mic Data RAM/ROM 24a) and specifies a target spectrum (in Target Data ROM 23a) that the apparatus is to use as an input to the filter design. When the filter design is complete, the operator names the filter via input device 80. A means is provided such that the filter, consisting of coefficients to be applied to time delay taps on the input and output data, can be stored in SRAM 14a memory associated with DSP 12.

Figure 6:
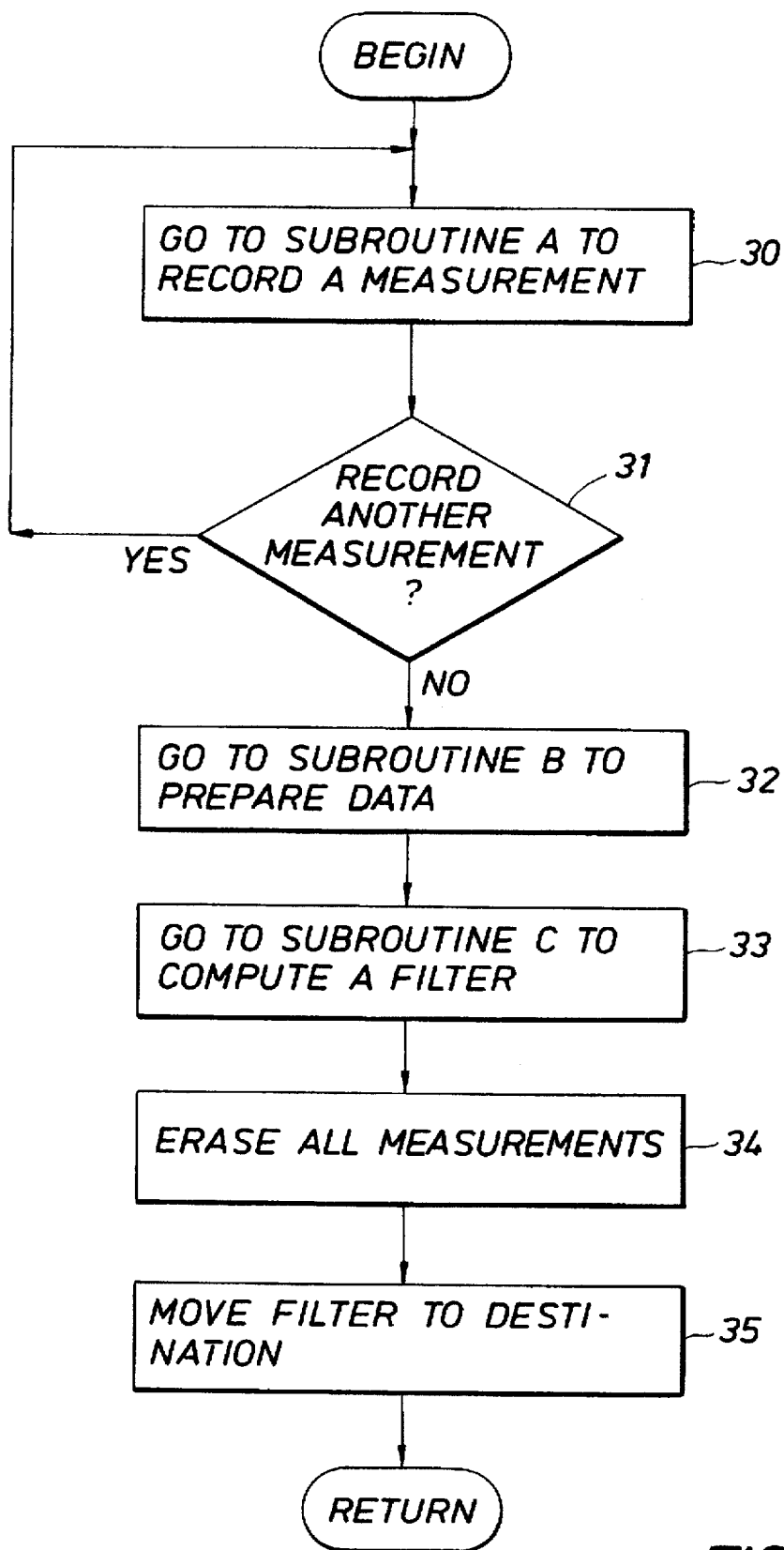
FIG. 6 is a flowchart which illustrates a computer program used to design a filter for the DSPs of FIGS. 3, 4, and 5.

FIG. 6 is a flowchart which depicts a computer program stored in Program ROM 22a to accomplish the process of collecting measurements, computing a filter and storing the filter to a desired destination. The flowchart of FIG. 6 provides an outline by which a computer programmer can readily prepare a computer program to control the operation of CPU 21a. An operator first connects the digital equalizer of 10a (FIG. 3) as indicated by FIG. 1 and places a microphone 63 in position for a measurement. The operator then initiates the program of FIG. 6. In FIG. 6, logic block 30 calls a subroutine which causes a measurement to be stored in Scratch RAM 27a. Control is next passed to the logic block 31, which causes the apparatus to query the operator (via a monitor not illustrated) as to whether another measurement should be recorded (provided sufficient Scratch RAM storage is available). The operator may then move the microphone to a different location and respond "Yes" via input device 80, and the sequence of recording a measurement is repeated. Otherwise, control is passed to the logic block 32. Logic block 32 calls a subroutine B which prepares data for the filter design. Logic block 33 calls subroutine C which causes a new filter to be generated and stored in Scratch RAM 27a of FIG. 3. Control is then passed to logic block 34 which causes the measurements to be erased from Scratch RAM 27a. Control is next passed to logic block 35 which causes the generated filter to be moved from Scratch RAM 14 to any of:

1) Filter SRAM 14a via the DSP (FIG. 3), or
2) ROM reproduction 28 via the Serial Port 26 (FIG. 3) which may be used as illustrated in FIG. 4, or
3) Filter SRAM 14a via the Serial Ports 26c and 15c (FIG. 5).

Figure 7:
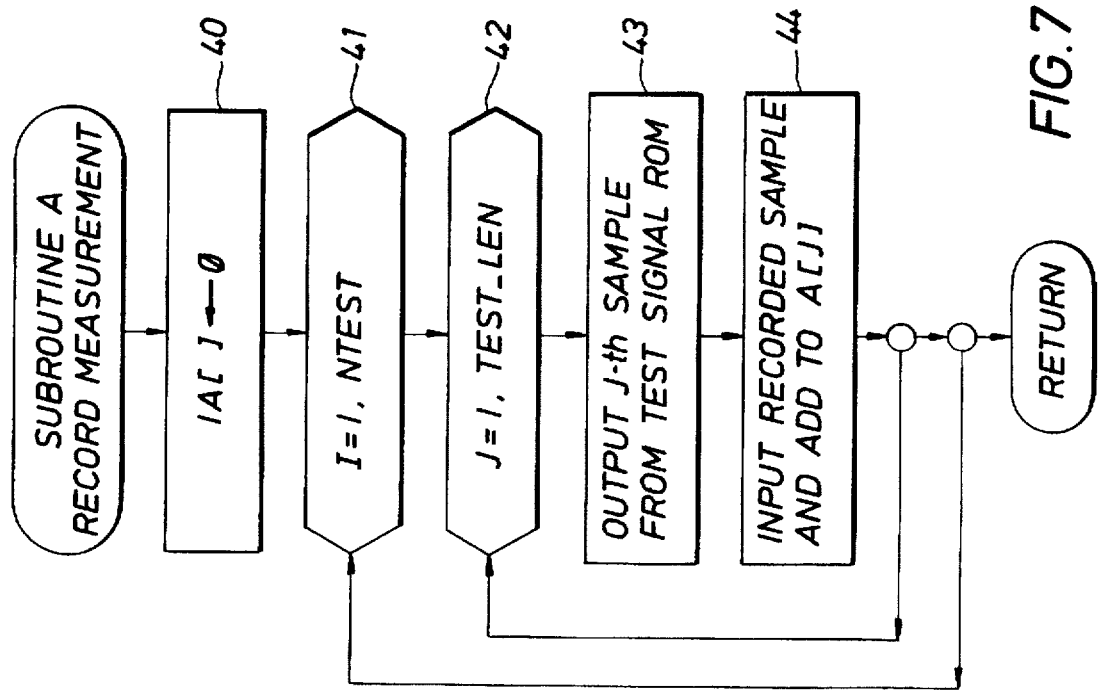
FIG. 7 is a flowchart which illustrates a computer program used in the process of recording a test signal.

FIG. 7 is a flowchart which enables a computer programmer to write code for causing a measurement to be stored in Scratch RAM 27a of FIG. 3. To begin, control passes to logic block 40 which initializes a block of memory, A[], to zero. Such memory is provided to store the summed data termed a measurement. Control then passes to logic block 41 which provides a loop of NTEST repetitions of playing a test signal. (NTEST had been a user input via an input device 80 [e.g., a keyboard]. Control then passes to logic block 42 which provides a loop of TEST_LEN repetitions where the test signal is played and recorded, sample by sample, where TEST_LEN is the number of samples in the test signal. The loops 41 and 42 cause blocks 43 and 44 to be repeated as indicated here. The test signal comprises TEST_LEN different digital audio data samples. Logic block 43 causes the J-th test signal sample to be applied to DSP 12 which in turn passes it to the Audio Digital Signal output lead 13 for D/A conversion, amplification, broadcast via the speaker system and recording in CPU 21a. Logic block 44 provides a means of storing a time series sample which had just previously been received from microphone 63, via Audio Digital Signal Input 11 and through DSP 12 to CPU 21a. That sample is then summed into A[J], (the J-th sample of A[]). After the completion of the indicated loops, the Scratch RAM 27a contains a single time sampled sequence stored in an array A[], which is termed a measurement.

Figure 8:
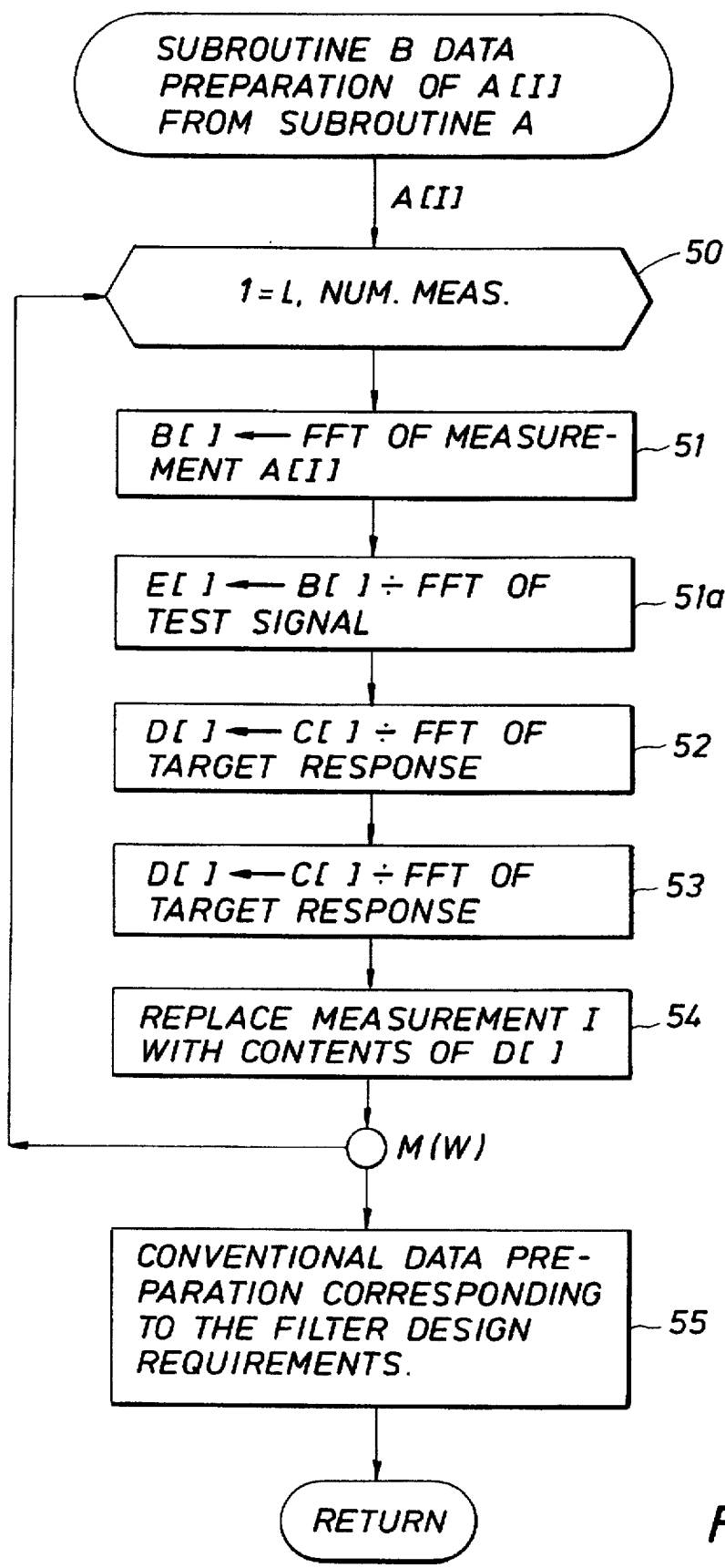
FIG. 8 is a flowchart which illustrates a computer program used in preparing measurement data for a filter production.

FIG. 8 is a flowchart which provides a computer programmer with an outline for production of code for data preparation required for filter generation. Many different kinds of filters may be generated. Consequently, there are a plurality of methods for data preparation as suggested by logic block 55. The sequence of operational steps shown in logic blocks 50, 51, 52, 53 and 54 illustrates a pre-processing of the measurement. Hence, the original measurement is, in effect, replaced by a new measurement. Such pre-processing is transparent to data preparation as required in block 55. Particular filter implementations may require different data preparation. For example, the Wiener-Levinson spiking deconvolution filter requires only that the average autocorrelation of the measurements be computed in the data preparation. With such knowledge as to the kind of filter to be generated, there may be more efficient ways to perform the steps of logic blocks 50, 51, 52, 53, 54 of FIG. 8.

Logic block 50 of FIG. 8 causes a number NUM_MEAS, repetitions of the enclosed code, of logic blocks 51–54, where NUM_MEAS is the number of repetitions. Logic Block 51 causes the Fast Fourier Transform FFT of the I-th measurement to be moved into the array B[] where the work arrays, A[], B[], C[], D[], and E[] are physically located in Scratch RAM 27a of CPU Section 21a. Logic block 51a creates an array E[] by dividing the FFT of the test signal into the array B[]. Logic block 52 creates an array C[] by dividing the FFT of the microphone response into the array E[]. Such division causes the effects of imperfections in the frequency response of the microphone to be removed from the measurement data.

Logic block 53 creates an array D[] by dividing the FFT of the target response stored in Target Data ROM 23a into the measurement, C[]. This operation, in conjunction with the specific requirement that the filter which is generated flatten the amplitude-frequency response of the "apparent" system, causes the resulting filter to shape the processed audio output spectrum to be that of the target response.

Logic block 54 causes the I-th measurement to be replaced with its pre-processed version, D[]. Block 55 is the remainder of the data preparation as would be prescribed by whatever filter design technique is eventually implemented. One way for implementing logic block 54 is to compute the average autocorrelation of the measurements.

Figure 9:
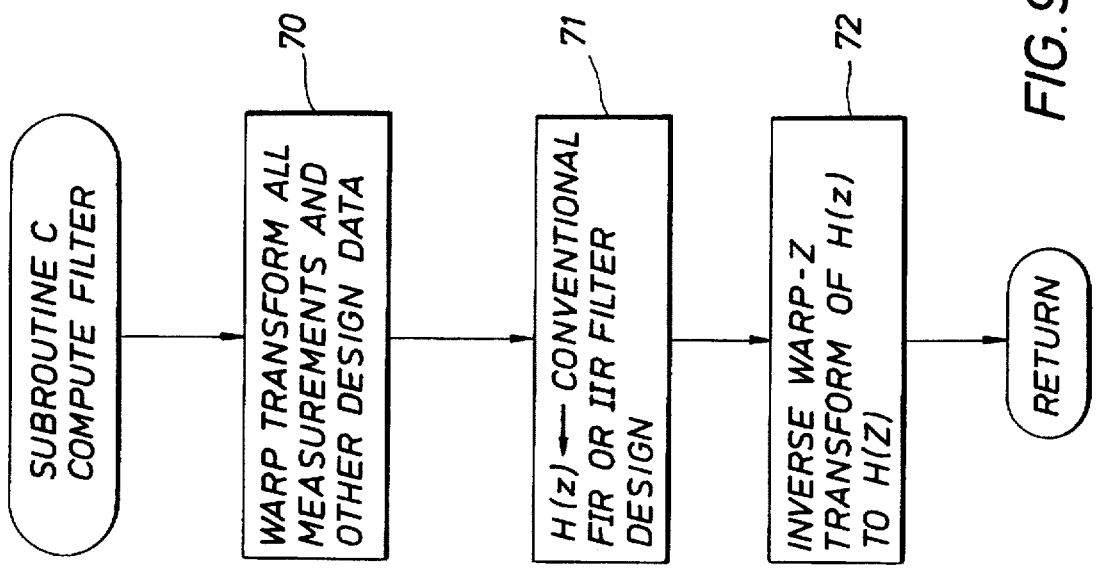
FIG. 9 is a flowchart which illustrates a computer program used in the process of creating a new filter from the measurement data.

FIG. 9 presents a flowchart which illustrates processing steps for filter generation as called for by logic block 33 of FIG. 6. In particular, logic block 71 is accomplished by any of a number of conventional FIR or IIR filter generating methods. Such methods are characterized in that variations in amplitude spectra occur (approximately) uniformly in frequency. The logic block 71 is preferred to be implemented by inverting and then smoothing (time windowing) the average power spectrum of the measurements and using the normal equations to produce the IIR filter $$H(z) = \frac{1}{F(z)} \quad (4)$$

where F(z) is the solution to the normal equations.

The process steps of logic blocks 70 and 72 are such that the final filter which is produced is characterized by a frequency spectrum which has variations in amplitude with high resolution at low frequencies and less resolution at higher frequencies, a pattern very similar to the acuity of the human ear. The purpose of logic block 72 is to modify the conventionally designed filter produced in logic block 71 resulting in a final filter with the desired properties. The transform of logic block 70 is called the "Warp-Z" transform. The transform of logic block 72 is called the "inverse Warp-Z" transform.

The inverse Warp-Z transform of logic block 72 transforms a conventionally designed FIR or IIR filter denoted by H(z) to a new IIR filter denoted H(Z). This mathematical transformation is defined as a mapping from the z-domain to the Z-domain given by $$z^{-1} = G(Z^{-1}) \quad (5)$$

That is, the $G(Z^{-1})$ transform is a symbolic algebraic substitution that transforms the filter H(z) to a new Z-domain filter denoted, H(Z). The $G(Z^{-1})$ transform maps a plurality of amplitudes and phases at uniformly spaced frequencies of H(z) in the z domain to new frequencies of H(Z) in the Z domain which are dense at low frequencies and less dense at high frequencies. This "moving" or translating of amplitudes and phases from one set of frequencies to another is called "warping", and the $G(Z^{-1})$ transform of logic block 72 is denoted as the "inverse Warp-Z" transform, because it un-does, or inverts, the effect of the forward transform in logic block 70.

The inverse warp transform $G(Z^{-1})$ has the following properties:

1) $G(Z^{-1})$ must be a rational function of $Z^{-1}$. That is, it must be a polynomial in $Z^{-1}$. Hence substituting $z^{-1} = G(Z^{-1})$ into H(z) will cause the resulting H(Z) to be a rational polynomial. The input, H(z) will be of the form of a FIR or an IIR filter. The output H(Z) will be an IIR filter.

2) The inside of the unit circle of the z-plane must map into the inside of the unit circle of the Z plane. Hence, poles and zeroes of H(z) which are inside the z-unit circle will map to poles and zeroes of H(Z) which are inside the Z-unit circle. Thus, if a filter characterized by H(z) is stable and minimum phase, a filter characterized by H(Z) will also be stable and minimum phase.

The most general form of the function, that satisfies the above requirements is $$G(Z^{-1}) = \pm \prod_{k=1}^{L} \frac{Z^{-1} - \alpha_k}{1 - \alpha_k Z^{-1}} \quad (6)$$

This particular transformation creates a transfer function H(Z) that is always an IIR filter.

Using such transformation during the process steps of this invention takes advantage of a specific attribute of the $G(Z^{-1})$ transformation: all points on the unit circle of the z-plane map to all points on the unit circle of the Z plane. The points on the unit circle in H(z) are precisely the amplitudes and phases of the transfer function of H(z), and similarly for H(Z).

Therefore by using the inverse warp transform in logic block 72, a plurality of amplitudes and phases at frequencies of a transfer function H(z) are mapped to new frequencies of a transfer function H(Z).

Values for L and $\alpha_k$ of the $G(Z^{-1})$ transform are chosen to satisfy the additional requirement that amplitudes and phases at uniformly spaced frequencies of H(z) map to new frequencies of H(Z) which are dense at low frequencies and less dense at high frequencies.

An example of choosing numerical values for constants L and $\alpha_k$ is presented below. The forward warping maps the z variables into Z variables where $\theta$ and $\omega$ are defined to be the frequency variables in the z-plane and the Z-plane, respectively, i.e., $z = e^{j\theta}$ and $Z = e^{j\omega}$, then $$e^{-j\theta} = |G(e^{-j\omega})| e^{j arg[G(e^{-j\omega})]} \quad (7)$$

Also, $$|G(e^{-j\omega})| = 1 \quad (8)$$

and $$\theta = -arg[G(e^{-j\omega})] \quad (9)$$

Figure 10:
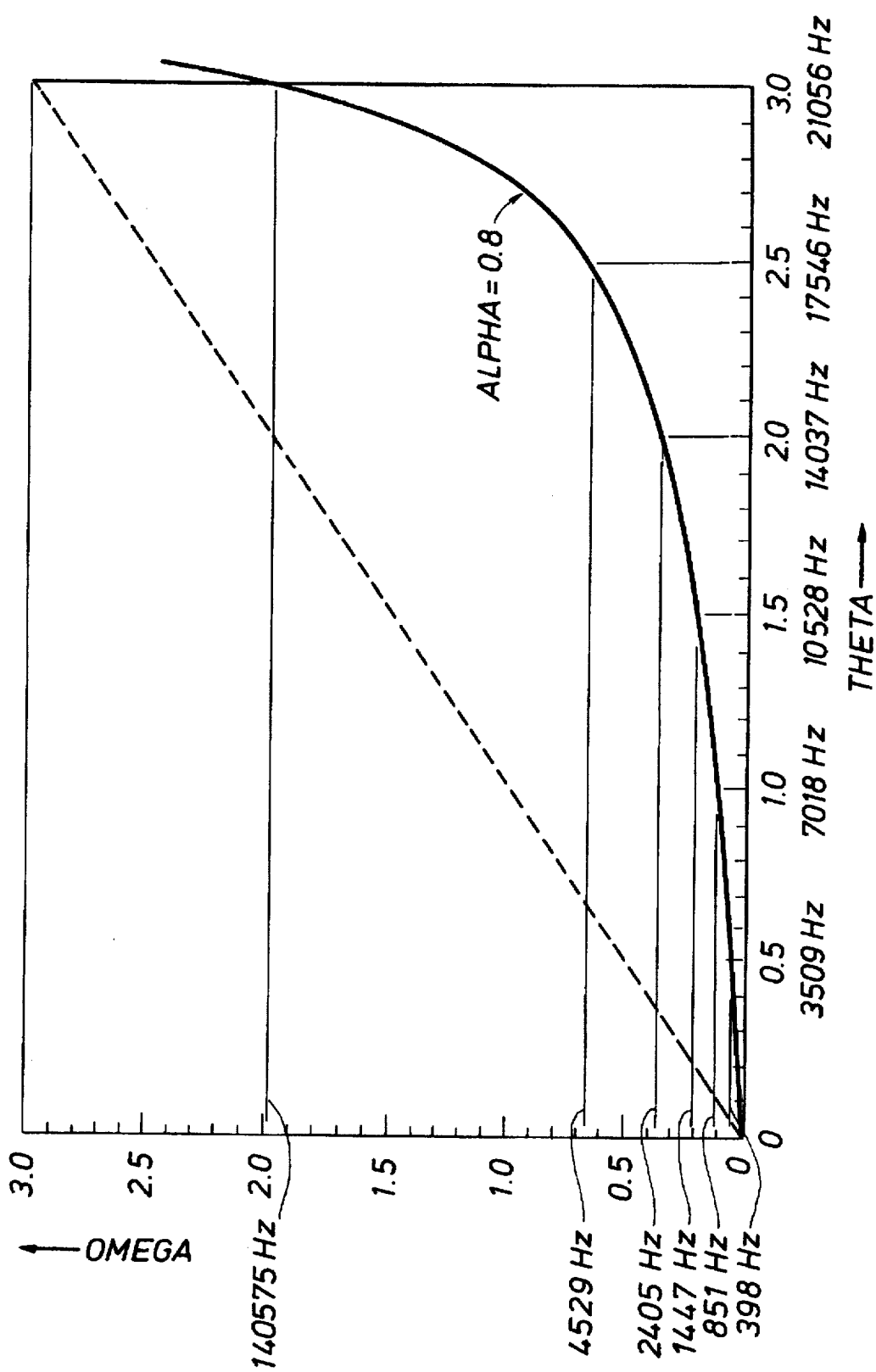
FIG. 10 is a graph which illustrates amplitude-frequency warping of an example Warp-Z transform.

Such equation describes the general relationship between frequencies in the z-plane and the Z-plane. It is well know that $$f_{Hertz} = \frac{\omega R}{2\pi} \quad (10)$$

where $f_{Hertz}$ is frequency in Hertz and R is the sample rate (ex. R=44.1 kHz). When L=1 and $\alpha_k$=0.8, then the relationship between $\theta$ and $\omega$ is plotted in FIG. 10. The frequencies shown in Hz correspond to a sample rate of 44.1 kHz. FIG. 10 shows, for example, that a frequency of $\theta$ of 10,528 Hz in the transfer function H(z) is mapped to a frequency $\omega$ of 1447 Hz in H(Z). That is, the inverse Warp-Z transform acts to squeeze amplitude responses of given frequency of the H(z) transfer function into lower frequencies of the H(Z) transfer function. Hence, the filter H(Z) exhibits the property of high resolution at low frequencies and less resolution at higher frequencies.

In the example above, values for L and $\alpha_k$ are chosen which give a form of $G(Z^{-1})$ which is similar to the acuity of human hearing (high resolution at low frequencies). The principles of the present invention are equally applicable to other values of L and $\alpha_k$. That is, other values of L and $\alpha_k$ can be chosen which provide high resolution at frequencies which are the most important for listening with a particular audio reproduction system. An example is where a speaker assembly has two speakers for low and high frequency reproduction which exhibit disturbances in the amplitude spectrum at frequencies near the crossover frequency of the speakers. The variables L and $\alpha_k$ can be chosen which provide the highest perceived resolution at the problem crossover frequency.

Referring to FIG. 9, logic block 70 provides a means to stretch amplitudes and phases out of the low frequencies and into the high frequencies in an equal and opposite manner to that of the inverse Warp-Z transform, which acts to squeeze amplitudes and phases into lower frequencies. Per the example presented above, logic block 70 transforms the amplitude (and phase) at a frequency of 1447 Hz to 10,528 Hz. The conventional filter generator of logic block 71 produces a filter based upon data having the transformed frequencies. Next the logic block 72 performs the inverse Warp-Z transform to restore the original frequencies. For example, the filter amplitude at a frequency of 10,528 Hz is mapped back to a frequency of 1447 Hz. More generally, logic block 70 warps amplitudes and phases using the mapping depicted in FIG. 10, in order to effectively stretch amplitude (and phase) responses out of the low frequencies. Logic block 70 performs these operations on the FFT form of all time domain data that is used in the conventional filter design.

The source code attached hereto at the end of this description under the heading "SOURCE CODE" presents a preferred embodiment of logic blocks 70, 71, and 72. The program language is c++. (Note, the source code uses equations where the sign of alpha is opposite that described above.)

There are a number of mathematically equivalent canonical forms which can be used to implement the IIR filter in the DSP 12 (FIGS. 3, 4 and 5). Because H(Z) has poles close to the unit circle, the best form is parallel biquadratic direct form I, using truncation error feedback (Wilson, "Filter Topologies", J. Audio Eng. Soc., Vol 41, No.9, 1993 September).

Various modifications and alterations in the described methods of manufacture and apparatus will be apparent to those skilled in the art of the foregoing description which does not depart from the spirit of the invention. For this reason, such changes are desired to be included within the scope of the appended claims. The appended claims recite the only limitations to a definition of the present invention. The descriptive manner which is employed for setting forth the embodiments should be interpreted as illustrative but not limitative.

SOURCE CODE

```
void TComputeFilterWindow::DoComputeData()
{
    short     track;
    long      I;
    extended  theta, omega, alpha;
    extended  pi       = arg(complex(-1.,0.));

// get some parms:

frame_cnt  room_frame_count;
    extended   room_sample_rate;
    short      room_track_count;
    short      RoomImpulse_count;
    this->GetRoomImpulseParms(room_frame_count, room_sample_rate, room_track_count,RoomImpulse_count);

frame_cnt  target_frame_count;
    extended   target_sample_rate;
    short      target_track_count;
    fTargetResponseSoundDoc->Get_SampleParms(target_frame_count, target_sample_rate, target_track_count);

//   Compute the power of 2.
```

-33-

```
long length = room_frame_count;

if (length < target_frame_count)

length = target_frame_count;

if (length < fIIR_length)

length = fIIR_length;

long power_2;

for (power_2 = 1; power_2 < length; power_2 *= 2);
```

----

// compute some constants

```
theta   = fWarpFreq / (room_sample_rate / 2.) * pi;

omega   = pi / 2.;

alpha   = sin((theta - omega)/2.) / sin((theta + omega)/2.);

fFilterSampleRate = room_sample_rate;
```

----

// creat fft instance

```
fft = new CFFT(FALSE);
```

----

// Get space for miscellaneous items.

```
RoomFFT_Hdl      = NewPermHandle(sizeof(Fract) * power_2 * room_track_count);
TargetFFT_Hdl    = NewPermHandle(sizeof(Fract) * power_2 * target_track_count);
work1_Hdl        = NewPermHandle(sizeof(Fract) * power_2 * room_track_count);
iir_Handle       = NewPermHandle(sizeof(extended) * fIIR_length);
auto_corr_Handle = NewPermHandle(sizeof(extended) * fIIR_length);
rhs_Handle       = NewPermHandle(sizeof(extended) * fIIR_length);
work2_Handle     = NewPermHandle(sizeof(extended) * fIIR_length * 2);

Fract *    RoomFFT_array   = (Fract *)    * RoomFFT_Hdl;
Fract *    TargetFFT_array = (Fract *)    * TargetFFT_Hdl;
Fract *    work1_array     = (Fract *)    * work1_Hdl;
extended * iir_array       = (extended *) * iir_Handle;
extended * auto_corr_array = (extended *) * auto_corr_Handle;
extended * rhs_array       = (extended *) * rhs_Handle;
extended * work2_array     = (extended *) * work2_Handle;

//----------------------------------------------------------------
// read room impulse files and compute FFT this->GetRoomFFT(RoomImpulse_count,room_track_count, power_2,
        RoomFFT_array, work1_array, fft, countDown);

//----------------------------------------------------------------
// read fTargetResponseSoundDoc (mono) and compute its FFT.

this->GetTargetFFT( target_frame_count, target_track_count, power_2,
```

```
                TargetFFT_array, fft, countDown);

---------------------------------------------------------------------------
//  At this point, the operator design begins.

ComputeAmplitudesForRealFFT(TargetFFT_array,power_2,countDown);

for (track = 0; track < room_track_count; track++) {

---------------------------------------------------------------------------
//          work1_array <- RoomFFT_array (amplitudes)
//          work1_array <- work1_array / TargetFFT_array
//          work1_array <- 1 / work1_array
//          WarpRealFFT(work1_array)
//          work1_array <- power
//          work1_array <- IFFT (gives autocorrelation)

for (I = 0; I < power_2; I++)          // copy power_2 / 2 complex points.
           work1_array[i] = RoomFFT_array[i];

DivideRealAmpFFTByRealAmpFFT(work1_array,TargetFFT_array,power_2,fNoisefloor_70dB,countDown);
        InvertRealAmpFFT(work1_array,power_2,fNoisefloor_70dB,countDown);
        WarpRealAmpFFT(work1_array,power_2,alpha,countDown);
        ConvertRealAmpFFTtoPower(work1_array,power_2,countDown);
        NormalizeForInverseFFT(work1_array,power_2,fft->Is_FFT_on_DSP());
        fft->Real_FFT(work1_array,-1,power_2/2,countDown);
```

```
//       iir_array  <- levnsn(auto_corr_array)

for (I = 0; I < fIIR_length; I++) {
        auto_corr_array[i] = work1_array[i];
        rhs_array[i] = 0.;
    }
    auto_corr_array[0] *= (1. + fPreWhiteningPercent / 100.);
    if (auto_corr_array[0] == 0.)      // no data in
        auto_corr_array[0] = 1.;
    rhs_array[0] = 1.;

levnsn(fIIR_length, iir_array, auto_corr_array, rhs_array, work2_array, countDown);

//       WarpTransform_BZ()
//   Note, The Warp transform generates iir_array[0] values different from one.
//
//   After this step, the A_Z[] / iir_array[] will hold the final transfer function.

extended A_Z[100];
    extended W[100];
    extended P[100];
    extended Q[100][101];

WarpTransform_BZ( A_Z, iir_array, N, alpha, W, P, Q);
```

-37-

```
        this->StoreFilter(A_Z, iir_array, fIIR.length)

exchangeRealFFTs(RoomFFT_array,power_2);   // exchange L/R channels
    }
} void WarpRealAmpFFT(Fract * array,long power_2, extended alpha,long& countDown)
{
/*
    This routine warps array[] to compress the high and stretcth the low
    frequencies (alpha <= 0).

The scaling used here assumes the lowest middle frequency is 300 Hz.

*/
    Fract   alpha_f, alpha_2, alpha_x2, alpha_A, alpha_B;
    Fixed   theta, omega;
    Fixed   pi_Fixed = FixATan2(1,1) * 4;
    Fract x,y, sin_f, cos_f;

short shift = 0;
```

```
Fract one  = X2Frac(1.0);

long i,k,i_theta,i_omega;

if (alpha < 0.) {

// Since we will be using the imaginary part to store counts, set it to zero.

for (I = 1; I < power_2/2; I++)
        array[2*I+1] = 0;

// Begin at the highest frequency and work down. Note, the lowest and highest
    // frequencies, (array[0] and array[1]), are not processed.

alpha_f    = X2Frac(alpha);
    alpha_2    = FracMul(alpha_f,alpha_f);
    alpha_x2   = (2 * alpha_f  ) / 2.;
    alpha_A    = (one - alpha_2 ) / 2.;
    alpha_B    = (one + alpha_2 ) / 2.;

for (i_theta = power_2/2 - 1; i_theta > 0; i_theta--) { checkWithUser(countDown);

// compute the source frequency for this target.
        // The use of Fixed here gives us about .7 Hz accuracy.
```

-39-

```
theta = FracMul(pi_Fixed,FracDiv(i_theta,power_2/2));

sin_f = FracSin(theta);

y = FracMul(alpha_A,sin_f);

cos_f = X2Frac(cos(Fix2X(theta)));

x = alpha_x2 + FracMul(alpha_B,cos_f);

omega = FixATan2(x,y);

i_omega = FracMul(power_2/2 - 1,Fix2Frac(FixDiv(omega,pi_Fixed)));

Fract source = array[2*i_theta];

if (array[2*i_omega+1] == 0)

array[2*i_omega ] = 0;

// if overflow, shift all results right if (array[2*i_omega] + (source >> shift) > one) { shift++;

for (k = i_omega; k < power_2/2; k++)

array[2*k] >>= 1;

} array[2*i_omega ] += source >> shift;

array[2*i_omega+1] += 1;

}
array[0] >>= shift;

array[1] >>= shift;
```

// The frequencies where the count is > 1 must be averaged:

```
for (I = 1; I < power_2/2; I++) {
    if (array[2*I+1] > 1) {
        array[2*I   ] /= array[2*I+1];
        array[2*I+1] = 1;
    }
}
```

// The frequencies where the count is 0 must be interpolated:

```
Fract amp_1, delta;
long ind_1;
Fract amp_0 = array[0];
long ind_0 = 0;

for (k = 1; k < power_2/2; k++) {
    if (array[2*k+1] == 1) {
        amp_1 = array[2*k];
        ind_1 = k;
        break;
    }
}
delta = 0;
if (ind_1 != ind_0)
    delta = (amp_1 - amp_0) / (ind_1 - ind_0);
```

```
for (I = 1; I < power_2/2; I++) { if (ind_1 == I) {
      amp_0 = amp_1;
      ind_0 = ind_1;
      for (k = ind_1+1; k < power_2/2; k++) {
         if (array[2*k+1] == 1) {
            amp_1 = array[2*k];
            ind_1 = k;
            break;
         }
      }
      delta = 0;
      if (ind_1 != ind_0)
         delta = (amp_1 - amp_0) / (ind_1 - ind_0);
   }
   array[2*I] = amp_0;
   amp_0 += delta;
}
for (I = 1; I < power_2/2; I++)
   array[2*I+1] = 0;

}
NormalizeToFrac(array,power_2);    // power_2 / 2 complex points

}
```

-42-

```
---------------------------------------------------------------------- long levnsn(   long op_length, extended * opr, extended * auto_corr, extended * rhs, extended * work, long& countDown)

{

//  This function computes the whitening operator using the Wiener-Levinson

//  inversion method. See Claerbout "Fundamentals of Geophysical Data Processing", //  pp 55-57, 141-142.

//

//  levnsn() returns the error code:

//    0   normal completion

//    1   op_length < 0

//    2   auto_corr[0] <= 0.

//    4   unstable inverse

//

//  op_length   operator length

//  opr         is the computed operator having op_length entries.

//  auto_corr   auto-correlation (unchanged)

//  rhs         right hand side vector (unchanged)

//  work        work area having (2 * op_length) entries extended err, x, v, eps;

long ier = 0;

if (op_length < 1)

ier = 1;

if (auto_corr[0] <= 0.)
```

-43-

```
   ier += 2;
if (ier)
   return ier;

v      = auto_corr[0];            // initialization
opr[0] = rhs[0] / v;
if (op_length == 1)
   return 0;
work[0]  = 1.;
long irhs = 0;
for (long I = 1; I < op_length; I++) {
   if (rhs[i] != 0.)
      irhs = 1;
   work[i] = 0.;
   opr[i]  = 0.;
}
for (long n = 1; n < op_length; n++) { if (gUserStatusDialog->Canceled(countDown)) {
      gUserStatusDialog->Close();
      Failure(noErr, messageCancelled);
   }
   countDown--;

eps = 0.;           // evaluate auxiliary error term
   for (I = 0; I < n; I++)
```

-44-

```
      eps += auto_corr[n - I] * work[i];

x = eps / v;            // update auxiliarly equations if (fabs(x) >= 1.)  return 4;      // return on instability for (I = 1; I < n+1; I++)
      work[i + op_length] = work[i] - x * work[n - I];

for (I = 1; I < n+1; I++)
      work[i] = work[i + op_length];

v -= x * eps;

if (irhs) { err = 0.;              // evaluate primary error term
      for (I = 0; I < n; I++)
         err += auto_corr[n - I] * opr[i];

x = (rhs[n] - err) / v;        // update primary equation
      for (I = 0; I < n+1; I++)
         opr[i] += x * work[n - I];
   }
}
if (!irhs) {
   x = rhs[0] / v;
```

-45-

```
    for (I = 0; I < op_length; I++)
        opr[i] = work[i] * x;
    }
    return 0;
}
```

---

```
void WarpTransform_BZ(extended * A,extended * B,short N,extended alpha, extended * W, extended * P, extended ** Q)
{
/*
    The input is 1. / B(Z) = 1. / (B[0] + B[1] Z^-1 + ... + B[N-1] Z^(N-1))

This routine performs the substitution Z^-1 = (alpha + z^-1) / (1 + alpha z^-1)

And returns the form A(z) / B(z).

W is a vector of N used as a work array.

P is a vector of N entries to hold polynomials of the form (alpha + Z^-1)^I, I = 0,...,N-1

Q is a pointer to vectors Q[i] for I = 0,...,N-1

Vector Q[i] has I+1 entries to hold the polynomial vector (1 + alpha * Z^-1)^I

*/
```

---

```
//  Initialize P = 1.
//  Initialize P1 = (alpha + z^-1)
//  Initialize Q1 = (1 + alpha * z^-1)
//  Initialize all of Q[i].
```

-46-

```
P[0] = 1.;

short len_P = 1;

extended P1[2];

P1[0] = alpha;

P1[1] = 1.;

extended Q1[2];

Q1[0] = 1.;

Q1[1] = alpha;

Q[0][0] = 1.;        // Q[0] polynomial for (short I = 1; I < N; I++) { short len_Q = 0;

PolyByPolyMultiplyAdd(Q[i],len_Q,Q1,2,Q[i-1],I);

}
```

----------------------------------------------------------------

```
// This loop accumulates the term: B[i] * Q1^(N-1-I) * P1^I into the polynomial A[]
// where   Q1 = (1 + alpha Z^-1)
// and     P1 = (alpha + Z^-1)

short len_A = 0;

for (I = 0; I < N; I++) { short len_W = 0;
```

```
      PolyByPolyMultiplyAdd( W, len_W, &B[i], 1, Q[N-1-I], N-I);

PolyByPolyMultiplyAdd( A, len_A, W, len_W, P, len_P);

if (I != N-1) { len_W = 0;

PolyByPolyMultiplyAdd( W, len_W, P, len_P, P1, 2);

len_P = len_W;

for (short j = 0; j < len_P; j++)

P[j] = W[j];

}

}

// -----------------------------------------------------------------

//   Copy the results to where they are needed.

for (I = 0; I < N; I++) {

B[i] = A[i];

A[i] = Q[N-1][I];

}

}
```

-48-

What is claimed is:

1. A method for generating a digital filter for an equalizer of an audio reproduction system comprising the steps of, recording a measurement signal m(t) of the response of said audio reproduction system, transforming said measurement signal into a frequency domain spectrum signal M(ω);

warping said frequency domain spectrum signal M(ω) such that amplitudes and phases of said frequency domain spectrum M(ω) are transformed into new frequencies such that the lower frequencies are stretched and the higher frequencies are condensed thereby producing a spectrum M'(ω), generating a digital filter H(z) based upon said spectrum M'(ω) where said digital filter is characterized by coefficients and corresponding filter taps, and inverse warping said digital filter H(z) to produce a filter H(Z) that has variations in amplitude characterized by high resolution at low frequencies and less resolution at higher frequencies, wherein said warping and inverse warping steps are accomplished by means of a transform $$z^{-1} = G(Z^{-1}) = \pm \prod_{k=1}^{L} \frac{Z^{-1} - \alpha_k}{1 - \alpha_k Z^{-1}}$$

and z and Z are related, by $z = e^{j\theta}$, $\theta$ = frequency variable in z domain $Z = e^{j\omega}$, $\omega$ = frequency variable in Z domain, $e^{-j\theta} = |G(e^{-j\omega})|e^{j\arg[G(e^{-j\omega})]}$ $|G(e^{-j\omega})| = 1$ $\theta = -\arg[G(e^{-j\omega})]$.

2. The method of claim 1 further comprising the step of storing coefficients and filter tap data of said filter H(Z) in a scratch RAM for use by a Digital Signal Processor of an equalizer of said audio reproduction system.

3. The method of claim 1 further comprising the step of storing coefficients and filter tap data of said filter H(Z) on a ROM for use by a Digital Signal Processor of an equalizer of said audio reproduction system.

4. A method for generating a digital filter for an equalizer of an audio reproduction system comprising the steps of, recording a measurement signal m(t) of the response of said audio reproduction system, transforming said measurement signal into a frequency domain spectrum signal M(ω);

warping said frequency domain spectrum signal M(ω) such that amplitudes and phases of said frequency domain spectrum M(ω) are transformed into new frequencies such that the lower frequencies are stretched and the higher frequencies are condensed thereby producing a spectrum M'(ω), generating a digital filter H(z) based upon said spectrum M'(ω) where said digital filter is characterized by coefficients and corresponding filter taps, inverse warping said digital filter H(z) to produce a filter H(Z) that has variations in amplitude characterized by high resolution at low frequencies and less resolution at higher frequencies, wherein a test signal, characterized by a test signal spectrum signal T(ω), is applied to said audio reproduction system and a microphone, characterized by a microphone response spectrum signal MIC(ω) which are used to produce said measurement signal m(t), and said frequency domain spectrum signal M(ω) is produced by the steps of applying a Fast Fourier Transform to said measurement signal m(t) to produce a frequency domain signal M'(ω), dividing M'(ω) by T(ω) to obtain a first modified measurement frequency domain signal, dividing said first modified measurement frequency domain signal by MIC(ω) to obtain a second modified measurement frequency domain signal, and dividing said second modified measurement frequency domain signal by a frequency domain signal of a desired target response to produce said frequency domain spectrum signal, M(ω).

5. The method of claim 4 further comprising the step of storing coefficients and filter tap data of said filter H(Z) in a scratch RAM for use by a Digital Signal Processor of an equalizer of said audio reproduction system.

6. The method of claim 4 further comprising the step of storing coefficients and filter tap data of said filter H(Z) on a ROM for use by a Digital Signal Processor of an equalizer of said audio reproduction system.

7. A ROM having digital filter coefficients and taps stored thereon for use by a DSP for an equalizer of an audio reproduction system, wherein said coefficients and taps are produced by a method comprising the steps of recording a measurement signal m(t) of the response of said audio reproduction system, transforming said measurement signal into a frequency domain spectrum signal M(ω);

warping said frequency domain spectrum signal M(ω) such that amplitudes and phases of said frequency domain spectrum M(ω) are transformed into new frequencies such that the lower frequencies are stretched and the higher frequencies are condensed thereby producing a spectrum M'(ω), generating a digital filter H(z) based upon said spectrum M'(ω) where said digital filter is characterized by coefficients and corresponding filter taps, and inverse warping said digital filter H(z) to produce a filter H(Z) that has variations in amplitude characterized by high resolution at low frequencies and less resolution at higher frequencies, wherein said warping step is accomplished by means of a $G(Z^{-1})$ transform where $$G(Z^{-1}) = \pm \prod_{k=1}^{L} \frac{Z^{-1} - \alpha_k}{1 - \alpha_k Z^{-1}}$$

and z and Z are related, by $z = e^{j\theta}$, $\theta$ = frequency variable in z domain $Z = e^{j\omega}$, $\omega$ = frequency variable in Z domain, $e^{-j\theta} = |G(e^{-j\omega})|e^{j\arg[G(e^{-j\omega})]}$ $|G(e^{-j\omega})| = 1$ $\theta = -\arg[G(e^{-j\omega})]$.

8. Apparatus for generating a digital filter for an equalizer of an audio reproduction system comprising means for generating a measurement response signal $M(\omega)$ which produces a desired system response over an audio reproduction path of said audio reproduction system, means for warping said frequency domain spectrum signal of said measurement response signal $M(\omega)$ such that amplitudes and phases of said frequency domain spectrum $M(\omega)$ are transformed into new frequencies such that the lower frequencies stretched and the higher frequencies are condensed, thereby producing a spectrum $M'(\omega)$, means for generating a digital filter $H(z)$ based upon said spectrum $M'(\omega)$ where said digital filter is characterized by coefficients and corresponding filter taps, and means for inverse warping said digital filter $H(z)$ such that a filter is produced $H(Z)$ that has variations in amplitude characterized by high resolution at low frequencies and less resolution at higher frequencies, wherein said means for warping includes means for performing a $G(Z^{-1})$ transform where said warping step is accomplished by means of a $G(Z^{-1})$ transform where $$G(Z^{-1}) = \pm \prod_{k=1}^{L} \frac{Z^{-1} - \alpha_k}{1 - \alpha_k Z^{-1}}$$

and z and Z are related, by $z = e^{j\theta}$, $\theta$ = frequency variable in z domain $Z = e^{j\omega}$, $\omega$ = frequency variable in Z domain, $e^{-j\theta} = |G(e^{-j\omega})|e^{j \arg[G(e^{-j\omega})]}$ $|G(e^{-j\omega})| = 1$ $\theta = -\arg[G(e^{-j\omega})]$.

9. The apparatus of claim 8 further comprising means for storing coefficients and filter taps data of said filter $H(Z)$ in a scratch RAM for use by a Digital Signal Processor of an equalizer of said audio reproduction system.

10. The apparatus of claim 8 further comprising means for recording a measurement signal $m(t)$ of the response of said audio reproduction system, means for transforming said measurement signal into a frequency domain spectrum signal $M(\omega)$;

and wherein said means for determining a filter response $H(z)$ includes means for determining a filter response $H(z)$ as a function of a predetermined target response, a frequency response of a test signal, and a frequency response of a microphone used to secure said test signal.

* * * * *